United States Patent
Chiu

(10) Patent No.: US 8,736,370 B2
(45) Date of Patent: May 27, 2014

(54) VARIABLE GAIN AMPLIFIER CIRCUIT

(75) Inventor: Ying-Chung Chiu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 87 days.

(21) Appl. No.: 13/590,128

(22) Filed: Aug. 20, 2012

(65) Prior Publication Data

US 2013/0147557 A1 Jun. 13, 2013

(30) Foreign Application Priority Data

Dec. 7, 2011 (TW) .............................. 100145153 A

(51) Int. Cl.
*H03F 3/45* (2006.01)

(52) U.S. Cl.
USPC .......................................... 330/254; 330/253

(58) Field of Classification Search
USPC ................................... 330/254, 253, 261, 69
See application file for complete search history.

(56) References Cited

U.S. PATENT DOCUMENTS

| | | | | |
|---|---|---|---|---|
| 6,985,035 | B1* | 1/2006 | Khorramabadi | 330/253 |
| 7,076,226 | B2* | 7/2006 | Bult et al. | 455/252.1 |
| 7,120,411 | B2 | 10/2006 | Darabi | |
| 7,196,582 | B2 | 3/2007 | Darabi et al. | |
| 7,245,181 | B2* | 7/2007 | Sanduleanu et al. | 330/253 |
| 7,560,990 | B2 | 7/2009 | Lin et al. | |
| 7,746,169 | B2* | 6/2010 | Deng et al. | 330/254 |
| 7,848,724 | B2* | 12/2010 | Bult et al. | 455/252.1 |
| 2003/0128071 | A1* | 7/2003 | Nguyen et al. | 330/254 |

* cited by examiner

*Primary Examiner* — Henry Choe
(74) *Attorney, Agent, or Firm* — Rabin & Berdo, P.C.

(57) ABSTRACT

A variable gain amplifier circuit is disclosed. The variable gain amplifier circuit includes a first transistor, a second transistor, a third transistor, a fourth transistor, a first gain switching circuit, and a second gain switching circuit. The first and the second transistors are respectively coupled to the first and the second nodes for receiving a differential input signal pair. The third transistor is coupled between the first node and a third node. The fourth transistor is coupled between the second node and a fourth node. The first gain switching circuit is coupled between the first node and the third node and further cross-coupled to the fourth node. The second gain switching circuit is coupled between the second node and the fourth node and further cross-coupled to the third node.

19 Claims, 4 Drawing Sheets

VARIABLE GAIN AMPLIFIER CIRCUIT

This application claims the benefit of Taiwan application Serial No. 100145153, filed Dec. 7, 2011, the subject matter of which is incorporated herein by reference.

BACKGROUND

1. Technical Field

The disclosure relates in general to an amplifier circuit, and more particularly to a variable gain amplifier circuit.

2. Description of the Related Art

In application of wireless network (such as Wi-Fi), a gain may need to be switched. Normally, the gain may be increased or varied by increasing or switching a transmission power and a reception power. The conventional gain switch to an amplifier may implemented by adjusting transconductance of a RF amplifier or by signal bypass.

In adjusting the gain by adjusting the transconductance, the current flowing through the amplifier must be reduced in order to reduce the gain. However, the linearity of the amplifier will be reduced at the same time.

If the gain is adjusted by way of signal bypassing, the current flowing through the amplifier does not change and the linearity of the amplifier is thus maintained. However, if the gain is adjusted at a large range, it needs more signal bypass paths. Consequently, extra parasitic capacitance is generated, making the amplifier unable to be operated at a high frequency.

SUMMARY OF THE DISCLOSURE

The disclosure is directed to a variable gain amplifier circuit which achieves gain adjustment by the subtraction/addition of signals.

According to an exemplary embodiment of the present disclosure, a variable gain amplifier circuit is disclosed. The variable gain amplifier circuit includes a first transistor, a second transistor, a third transistor, a fourth transistor, a first gain switching circuit, and a second gain switching circuit. The first and the second transistors are respectively coupled to first and second nodes for receiving a differential input signal pair. The third transistor is coupled between the first node and a third node. The fourth transistor is coupled between the second node and a fourth node. The first gain switching circuit is coupled between the first node and the third node and further cross-coupled to the fourth node. The second gain switching circuit is coupled between the second node and the fourth node and further cross-coupled to the third node.

According to another exemplary embodiment of the present disclosure, a variable gain amplifier circuit is disclosed. The variable gain amplifier circuit includes a first transistor, a second transistor, a third transistor, a fourth transistor, a first gain switching circuit, and a second gain switching circuit. The first and the second transistors are respectively coupled to first and second nodes for receiving a differential input signal pair. The third transistor is coupled between the first node and a third node. The fourth transistor is coupled between the second node and a fourth node. The third and the fourth transistors are coupled to a fixed voltage. The first gain switching circuit includes a first switch set and a second switch set. The first switch set includes one or more switch devices coupled in parallel and coupled to the third node. The second switch set includes one or more switch devices coupled in parallel and coupled to the fourth node. The second gain switching circuit includes a third switch set and a fourth switch set. The third switch set includes one or more switch devices coupled in parallel and coupled to the fourth node. The fourth switch set includes one or more switch devices coupled in parallel and coupled to the third node.

According to an alternate exemplary embodiment of the present disclosure, a variable gain amplifier circuit is disclosed. The variable gain amplifier circuit includes a first transistor, a second transistor, a third transistor, a fourth transistor, a first gain switching circuit, and a second gain switching circuit. The first and the second transistors respectively are coupled to first and second nodes for receiving a differential input signal pair. The third transistor is coupled between the first node and a third node. The fourth transistor is coupled between the second node and a fourth node. The third and the fourth transistors are coupled to a fixed voltage. The first gain switching circuit includes a first current path and a second current path. The first current path is coupled between the first node and the third node. The second current path is coupled between the first node and the fourth node. The second gain switching circuit includes a third current path and a fourth current path. The third current path is coupled between the second node and the fourth node. The fourth current path is coupled between the second node and the third node.

The above and other contents of the disclosure will become better understood with regard to the following detailed description of the preferred but non-limiting embodiment(s). The following description is made with reference to the accompanying drawings.

Figure 1:
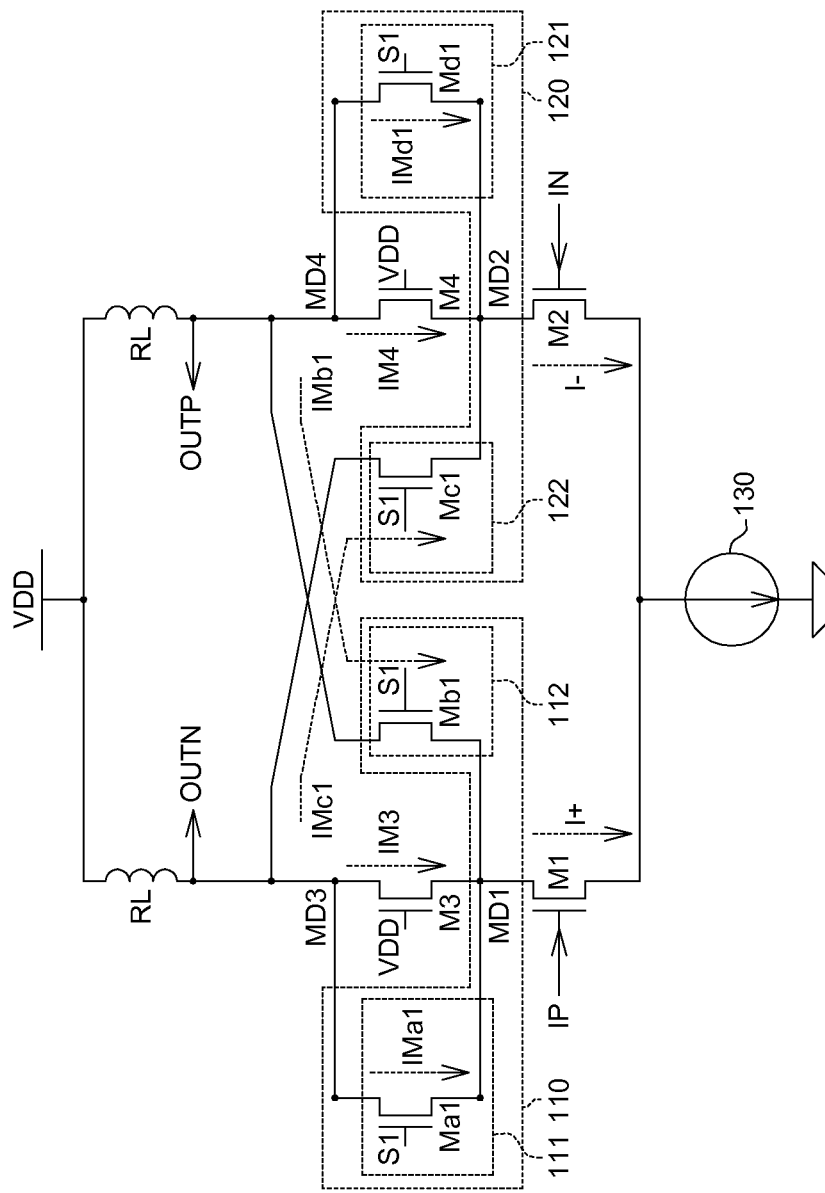
FIG. 1 shows a circuit diagram of a variable gain amplifier circuit according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE DISCLOSURE

In the disclosure and in claims, "couple" refers to direct or indirect connection. For example, the description "a first device is coupled to a second device" refers to that (1) the first device is directly connected to the second device or (2) the first device is indirectly coupled to the second device via other device or other connections.

Referring to FIG. 1, a circuit diagram of a variable gain amplifier circuit according to an embodiment of the disclosure is shown. As indicated in FIG. 1, the variable gain amplifier circuit 100 includes a first transistor M1, a second transistor M2, a third transistor M3 and a fourth transistor M4. The first transistor M1 and the second transistor M2 are respectively coupled to a first node MD1 and a second node MD2 for receiving a differential input signal pair IP and IN. The third transistor M3 is coupled between the first node MD1 and a third node MD3 (an output signal OUTN is outputted from the third node MD3). The fourth transistor M4 is coupled between the second node MD2 and a fourth node MD4 (an output signal OUTP is outputted from the fourth node MD4). The third node MD3 and the fourth node MD4 output the differential signal output pair OUTN and OUTP. The transistors M1-M4 are also referred to as a cascoded amplifier main circuit. Also, gates of the third transistor M3 and the fourth transistor M4 are both coupled to a reference voltage, which may be a fixed voltage, Under a normal operation, the fixed voltage turns on the third transistor M3 and the fourth transistor M4. The fixed voltage is exemplified by an operating voltage VDD, but the present disclosure is not limited thereto.

In addition, the variable gain amplifier circuit 100 further includes a first gain switching circuit 110 and a second gain switching circuit 120. The first gain switching circuit 110 is coupled between the first node MD1 and the third node MD3, and further cross-coupled to the fourth node MD4. The second gain switching circuit 120 is coupled between the second node MD2 and the fourth node MD3, and further cross-coupled to the third node MD3.

In addition, the variable gain amplifier circuit 100 further includes a current source (e.g., a constant current source) 130, which may be coupled to drains of the first transistor M1 and the second transistor M2. In addition, the variable gain amplifier circuit 100 may optionally include two inductive loads RL.

The first gain switching circuit 110 may include a first current path IMa1 and a second current path IMb1. The first current path IMa1 is coupled between the first node MD1 and the third node MD3. The second current path IMb1 is coupled between the first node MD1 and the fourth node MD4. The first current path IMa1 passes through the transistor Ma1 and is switched by a first switch control signal S1. The second current path IMb1 passes through the transistor Mb1 and is switched by a second switch control signal $\overline{S1}$. The phase of the second switch control signal $\overline{S1}$ inverted to that of the first switch control signal S1.

Like the first gain switching circuit 110, the second gain switching circuit 120 includes a third current path IMd1 and a fourth current path IMc1. The third current path IMd1 is coupled between the second node MD2 and the fourth node MD4. The fourth current path IMc1 is coupled between the second node MD2 and the third node MD3. The third current path IMd1 passes through the transistor Md1 and is switched by the first switch control signal S1. The fourth current path IMc1 passes through the transistor Mc1 and is switched by the second switch control signal $\overline{S1}$.

In a practical example for implementing the first current path IMa1 and the second current path IMb1, the first gain switching circuit 110 may include a first switch set 111 and a second switch set 112. The first switch set 111 is coupled to the third transistor M3 in parallel and is further coupled to the third node MD3. The second switch set 112 may be coupled between the first node MD1 and the fourth node MD4. It is noted that in FIG. 1, each of the first switch set 111 and the second switch set 112 may include a switch device, which may be realized by a transistor Ma1 or a transistor Mb1, but the present disclosure is not limited thereto. For example, in other embodiments, the first switch set 111 and the second switch set 112 may include more switch devices. In other embodiments, the above switch devices may be realized by other types of transistors.

Similarly, in a practical example for implementing the third current path IMd1 and the fourth current path IMc1, the second gain switching circuit 120 may include a third switch set 121 and a fourth switch set 122. The third switch set 121 is coupled to the fourth transistor M4 in parallel and is further coupled to the fourth node MD4. The fourth switch set 122 may be coupled between the second node MD2 and the third node MD3. It is noted that in FIG. 1, each of the third switch set 121 and the fourth switch set 122 may include a switch device. The switch devices may be realized by a transistor Md1 or a transistor Mc1, but the present disclosure is not limited thereto. For example, in other embodiments, the first switch set 111 and the second switch set 112 may include more switch devices. In other embodiments, the above switch devices may be realized by other types of transistors.

During operation, the first switch set 111 and the third switch set 121 are switched in response to the first switch control signal S1. The second switch set 112 and the fourth switch set are switched in response to the second switch control signal $\overline{S1}$. To put it in greater details, the transistor Ma1, used as the switch device of the first switch set 111, is coupled between the first node MD1 and the third node MD3, and the gate of the transistor Ma1 is coupled to the first switch control signal S1. The transistor Md1, used as the switch device of the third switch set 121, is coupled between the second node MD2 and the fourth node MD4, and the gate of the transistor Md1 is coupled to the first switch control signal S1.

The transistor Mb1, used as the switch device of the second switch set 112, is coupled between the first node MD1 and the fourth node MD4, and the gate of the transistor Mb1 is coupled to the second switch control signal $\overline{S1}$. The transistor Mc1, used as the switch device of the fourth switch set 122, is coupled between the second node MD2 and the third node MD3, and the gate of the transistor Mc1 is coupled to the second switch control signal $\overline{S1}$.

In the present embodiment, a wide range of gain adjustment may be achieved without changing the currents flowing through the transistors M1 and M2 so that the linearity of the amplifier is maintained. Detailed operations are exemplified below.

The transistors have the following size ratio relationship: M1=M2, M3=M4, Ma1=Mb1=Mc1=Md1.

For the direct current (DC) signals, I+=I−, IM3=IM4, IMa1=IMb1=IMc1=IMd1 (for convenience of elaboration, IMa1~IMd1=Ix). The currents I+ and I− are the currents flowing through the transistors M1 and M2, respectively. The currents IM3 and IM4 are the currents flowing through the transistors M3 and M4, respectively. Therefore, the alternating current (AC) signals passing through the transistors M3 and M4 have the same magnitude but have inverse phases (SM3=SM4, SM3 and SM4 respectively denote the AC signals passing through the transistors M3 and M4). The AC signals passing through the transistors Ma1 and Mb1 have the same magnitude and the same phase (SMa1=SMb1, wherein, SMa1 and SMb1 respectively denote the AC signals passing through the transistors Ma1 and Mb1). The AC signals passing through the transistor Mc1 and Md1 have the same magnitude and the same phase (SMc1=SMd1, wherein, SMc1 and SMd1 respectively denote the AC signals passing through the transistor Mc1 and Md1). The AC signals passing through the transistors Ma1 and Mc1 have the same magnitude but have inverse phases. The AC signals passing through the transistor Mb1 and Md1 have the same magnitude but have inverse phases.

When the first switch control signal S1 is at high potential (H), the transistors Ma1 and Md1 are turned on, but the transistors Mb1 and Mc1 are turned off (IMb1=IMc1=0). Thus, when the first switch control signal S1 is at a high potential (H), the currents I+ and I– respectively are expressed as follows:

$$I+(H)=IM3+IMa1=IM3+Ix$$

$$I-(H)=IM4+IMd1=IM4+Ix$$

Figure 2A:
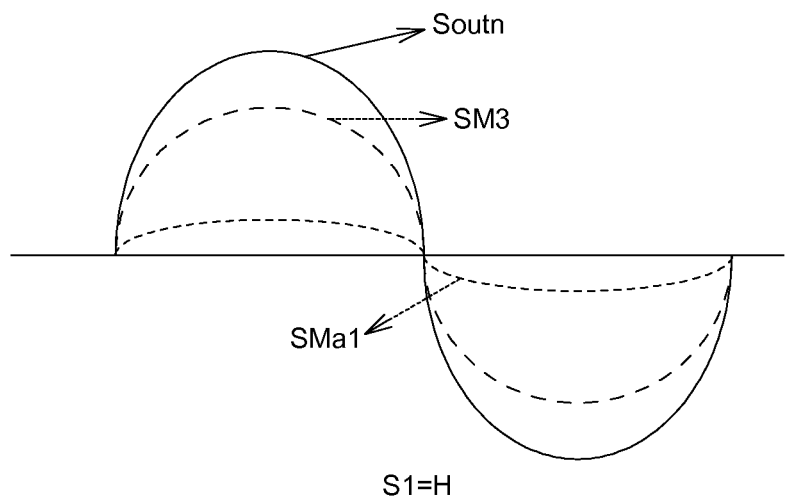
FIG. 2A and FIG. 2B respectively show addition and subtraction of AC signal by the variable gain amplifier circuit of FIG. 1.

When the first switch control signal S1 is at high potential (H), the gain of the amplifier 100 is maximum. This is because the AC signal SM3 flowing through the transistor M3 and the AC signal SMa1 flowing through the transistor Ma1 have the same phase, and the AC signal SM4 flowing through the transistor M4 and the AC signal SMd1 flowing through the transistor Md1 have the same phase. Therefore, when the first switch control signal S1 is at the high potential (H), the AC signals are added as indicated in FIG. 2A. The AC signal Soutn(H) of the output signal OUTN is expressed as: Soutn(H)=SM3+SMa1. Similarly, the AC signal Soutp(H) of the output signal OUTP is expressed as: Soutp(H)=SM4+SMd1.

Conversely, when the first switch control signal S1 is at a low potential (L), the transistors Ma1 and Md1 are turned off (IMa1=IMd1=0) but the transistors Mb1 and Mc1 are turned on. When the first switch control signal S1 is at the low potential (L), the currents I+ and I– respectively are expressed as follows:

$$I+(L)=IM3+IMb1=IM3+Ix$$

$$I-(L)=IM4+IMc1=IM4+Ix$$

Figure 2B:
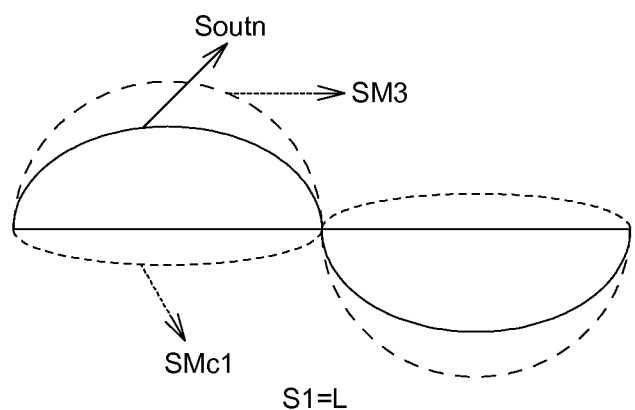

When the first switch control signal S1 is at the low potential (L), the gain of the amplifier 100 is minimum. This is because the AC signal SM3 flowing through the transistor M3 and the AC signal SMa1 flowing through the transistor Ma1 have inverse phases, and the AC signal SM4 flowing through the transistor M4 and the AC signal SMd1 flowing through the transistor Md1 have inverse phases. Therefore, when the first switch control signal S1 is at the low potential (L), the AC signals are subtracted as indicated in FIG. 2B. The AC signal Soutn(L) of the output signal OUTN is expressed as: Soutn(L)=SM3−SMc1. Similarly, the AC signal Soutp(L) if the output signal OUTP is expressed as: Soutp(L)=SM4−SMb1.

No matter whether the first switch control signal S1 is at high or at low potential, the currents I+ and I– flowing through the transistors M1 and M2 remain unchanged (I+(H)=I+(L)=IM3+Ix; I–(H)=I–(L)=IM4+Ix).

The AC signal Soutn(H) of the output signal OUTN at the H first switch control signal S1 is different from the AC signal Soutn(L) of the output signal OUTN at the L first switch control signal S1 by 2 SMa1, hence enlarging the range of adjustable gain.

$$Soutn(H)-Soutn(L)=SMa1+SMc1=2Ma1$$

Likewise, the AC signal Soutp(H) of the output signal OUTP at the H first switch control signal S1 is different from the AC signal Soutp(L) of the output signal OUTP at the L first switch control signal S1 by 2 SMd1, hence enlarging the range of adjustable gain.

$$Soutp(H)-Soutp(L)=SMd1+SMb1=2Md1$$

To summarize, the range of adjustable gain of the amplifier 100 of the present embodiment is enlarged, and the current flowing through the amplifier may not change when the gain is switched or adjusted, so that the linearity of the amplifier is maintained.

Figure 3:
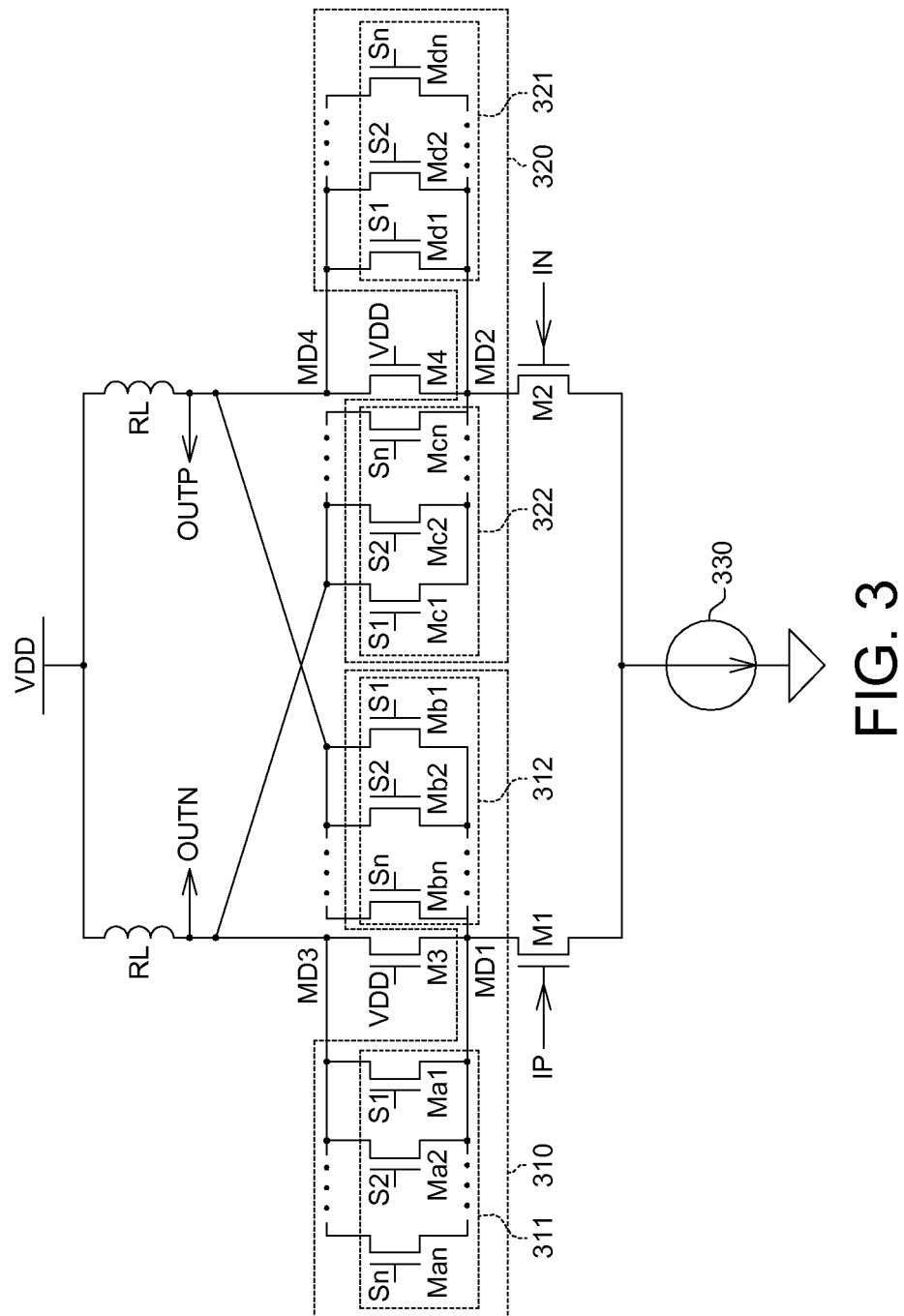
FIG. 3 shows a circuit diagram of a variable gain amplifier circuit according to another embodiment of the disclosure.

FIG. 3 shows a circuit diagram of a variable gain amplifier circuit 300 according to another embodiment of the disclosure. Referring to FIG. 3. The variable gain amplifier circuit 300 includes transistors M1~M4, a first gain switching circuit 310, a second gain switching circuit 320, a constant current source 330 and an optional inductive load RL. FIG. 3 is different from FIG. 1 in that the first and the second gain switching circuits have different numbers of switch devices. The operations and circuit configuration of the first and the second gain switching circuits of the variable gain amplifier circuit 300 of FIG. 3 are disclosed below. Detailed descriptions of other elements of the variable gain amplifier circuit 300 are made with reference to the variable gain amplifier circuit 100 of FIG. 1, and are not repeated here.

The first gain switching circuit 310 includes a first switch set 311, and a second switch set 312. The first switch set 311 includes a plurality of switch devices coupled in parallel and coupled to the third node MD3. The second switch set 312 includes a plurality of switch devices coupled in parallel and coupled to the fourth node MD4. The first switch set 311 is further coupled in parallel with the third transistor M3.

The second gain switching circuit 320 includes a third switch set 321, and a fourth switch set 322. The third switch set 321 includes a plurality of switch devices coupled in parallel and coupled to the fourth node MD4. MD4. The fourth switch set 322 includes a plurality of switch devices coupled in parallel and coupled to the third node MD3. The third switch set 321 is further coupled in parallel with the fourth transistor M4.

The first switch set 311 and the third switch set 321 are switched in response to a first set of switch control signals S1~Sn. The second switch set 312 and the fourth switch set 322 are switched in response to a second set of switch control signals $\overline{S1}$~$\overline{Sn}$. The phase of the second set of switch control signals $\overline{S1}$~$\overline{Sn}$ is inverse to that of the first set of switch control signals $\overline{S1}$~$\overline{Sn}$.

As indicated in the exemplary example of FIG. 3, a plurality of switch devices of the first switch set 311 may include a plurality of transistors Ma1~Man coupled in parallel between the first node MD1 and the third node MD3, and the gates of the transistors Ma1~Man are coupled to the first set of switch control signals S1~Sn.

Also, a plurality of switch devices of the second switch set 312 may include many transistors Mb1~Mbn coupled in parallel between the first node MD1 and the fourth node MD4, and the gates of the transistors Mb1~Mbn are coupled to the second set of switch control signals $\overline{S1}$~$\overline{Sn}$.

Similarly, the switch devices of the third switch set 321 may include many transistors Md1~Mdn coupled in parallel between the second node MD2 MD2 and the fourth node MD4, and the gates of the transistors Md1~Mdn are coupled to the first set of switch control signals $\overline{S1}$~$\overline{Sn}$.

Also, a plurality of switch devices of the fourth switch set 322 may include many transistors Mc1~Mcn coupled in parallel between the second node MD2 and the third node MD3, and the gates of the transistors Mc1~Mcn are coupled to the second set of switch control signals $\overline{S1}$~$\overline{Sn}$.

The transistors have the following size ratio relationship: M1=M2; M3=M4; Ma1=Md1, Ma2=Md2, . . . , Man=Mdn; Mb1=Mc1, Mb2=Mc2, . . . , Mbn=Mcn. In the present embodiment, since the circuit is differential, Ma1=Md1, Ma2=Md2, . . . , Man=Mdn; Mb1=Mc1, Mb2=Mc2, . . . , Mbn=Mcn. In other possible embodiments of the present disclosure, in order to fix the operation frequency of the amplifier in gain switch, and the transistors have the following size ratio relationship: Ma1=Mb1=Mc1=Md1, Ma2=Mb2=Mc2=Md2, . . . , Man=Mbn=Mcn=Mdn.

The principles of the operations of the variable gain amplifier circuit 300 of FIG. 3 are similar or identical to that of the variable gain amplifier circuit 100 of FIG. 1, and the details are not repeated here.

It is noted that, by controlling the logic levels of the first set of switch control signals S1~Sn and the second set of switch control signals $\overline{S1}$~$\overline{Sn}$, the variable gain amplifier circuit 300 of FIG. 3 may have different gains. For example, when one of the first set of switch control signals S1~Sn is transited to high, the gain of the variable gain amplifier circuit 300 is increased. Conversely, when one of the first set of switch control signals S1~Sn is transited to low, the gain of the variable gain amplifier circuit 300 is decreased. When the signals of the first set of switch control signals S1~Sn are all at high, the gain of the variable gain amplifier circuit 300 of FIG. 3 is at a maximum. When the signals of the first set of switch control signals S1~Sn are all at low, the gain of the variable gain amplifier circuit 300 is at a minimum.

Like FIG. 1, the first gain switching circuit 310 may also be implemented to include a first current path and a second current path. The first current path is coupled between the first node MD1 and the third node MD3. The second current path coupled between the first node MD1 and the fourth node MD4. The second gain switching circuit 320 may also be implemented to include a third current path coupled and a fourth current path. The third current path is coupled between the second node MD2 and the fourth node MD4. The fourth current path is coupled between the second node MD2 and the third node MD3. The first current path and the third current path are switched by the first set of switch control signals S1~Sn. The second current path and the fourth current path are switched by the second set of switch control signals $\overline{S1}$~$\overline{Sn}$. Also, when the first set of switch control signals S1~Sn (or the second set of switch control signals $\overline{S1}$~$\overline{Sn}$) has a combination of different levels or has different numbers of high level and low-level signals, the current paths may have different equivalent resistances, so as to change the gain of the variable gain amplifier circuit 300.

Similarly, in gain switch, the currents flowing through the transistors M1 and M2 of the variable gain amplifier circuit 300 may remain unchanged, so that the linearity of the amplifier is maintained, and the variable gain amplifier circuit 300 may achieve wide range of gain adjustment.

Figure 4:
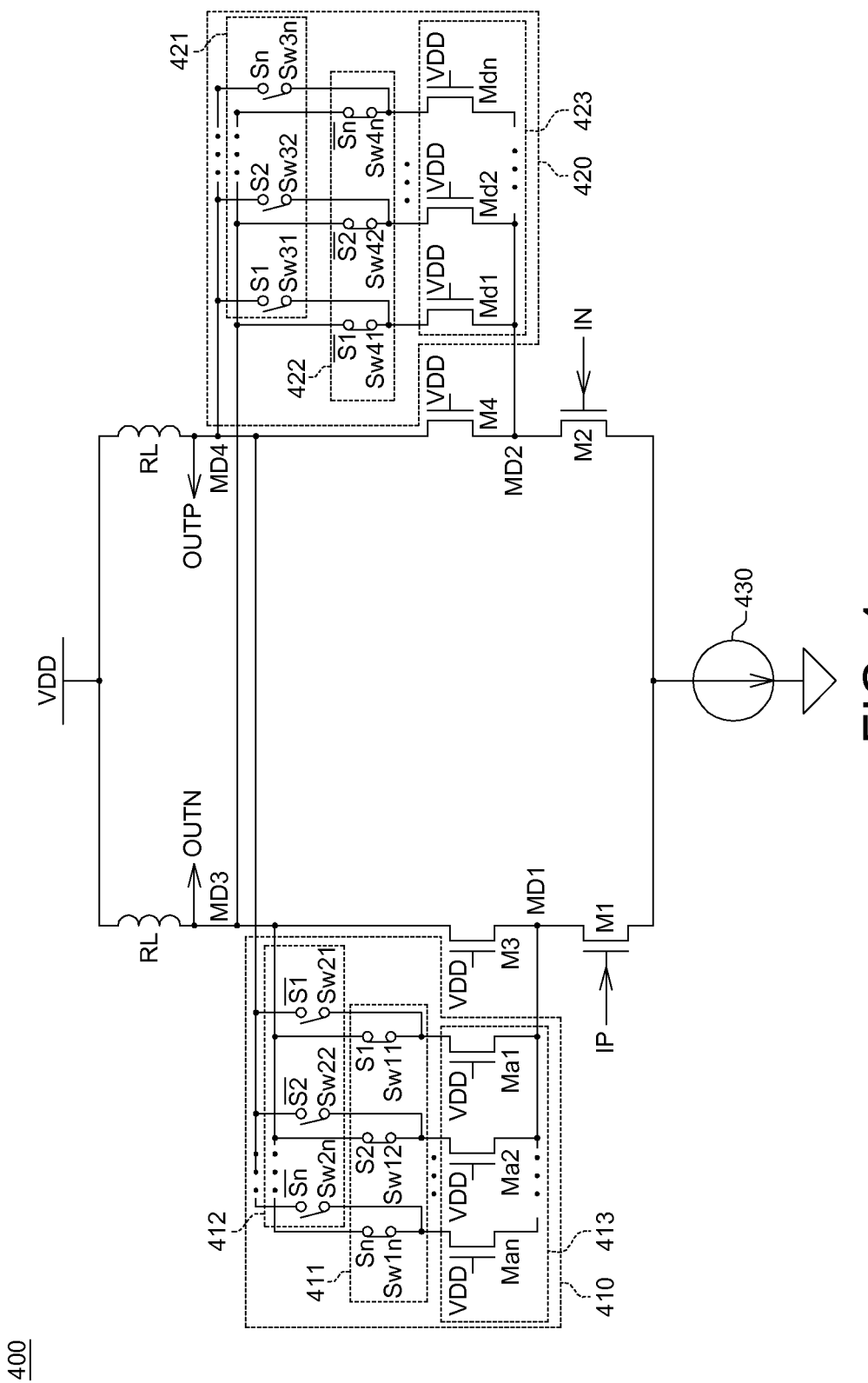
FIG. 4 shows a circuit diagram of a variable gain amplifier circuit according to an alternate embodiment of the disclosure.

Referring to FIG. 4, a circuit diagram of a variable gain amplifier circuit 400 according to an alternate embodiment of the disclosure is shown. Referring to FIG. 4. The variable gain amplifier circuit 400 includes transistors M1~M4, a first gain switching circuit 410, a second gain switching circuit 420, a constant current source 430 and an optional inductive load RL. The operations and circuit configuration of the first and the second gain switching circuits of the variable gain amplifier circuit 400 are disclosed below. Detailed descriptions of other elements of the variable gain amplifier circuit 400 are made with reference to the variable gain amplifier circuit 100 and 300, and are not repeated here.

The first gain switching circuit 410 includes a first switch set 411, a second switch set 412 and a first set of gain transistors 413. The first set of gain transistors 413 may include many gain transistors Ma1~Man coupled among the first node MD1, the first switch set 411 and the second switch set 412. The gates of the gain transistors Ma1~Man of the first set of gain transistors 413 are coupled to the fixed voltage VDD. In other possible embodiments of the present disclosure, the first set of gain transistors may include only one gain transistor, and is still within the spirit of the present disclosure. In other words, the first gain switching circuit 410 of FIG. 4 is different from the first gain switching circuit 310 of FIG. 3 in that the first gain switching circuit 410 additionally includes the first set of gain transistors 413 coupled among the first node MD1, the first switch set 411 and the second switch set 412.

The second gain switching circuit 420 includes a third switch set 421, a fourth switch set 422 and a second set of gain transistors 423. The second set of gain transistors 423 includes gain transistors Md1~Mdn coupled among the second node MD2, the third switch set 421 and the fourth switch set 422. The gates of the gain transistors Md1~Mdn of the second set of gain transistors 423 are coupled to the fixed voltage VDD. In other possible embodiments of the present disclosure, the second set of gain transistors may include only one gain transistor and is still within the spirit of the present disclosure. In other words, the second gain switching circuit 420 of FIG. 4 is different from the second gain switching circuit 320 of FIG. 3 mainly in that the second gain switching circuit 420 additionally includes the second set of gain transistors 423 coupled among the second node MD2, the third switch set 421 and the fourth switch set 422.

Like FIG. 3, in a practical example, the first switch set 411 may include a plurality of switch devices coupled in parallel and coupled to the third node MD3. The switch device of the first switch set 411 includes switches SW11~SW1n which are coupled between the third node MD3 and the gain transistors Ma1~Man of the first set of gain transistors 423 and the switches SW11~SW1n are switched in response to the first set of switch control signals S1~Sn.

Also, the second switch set 412 may include a plurality of switch devices coupled in parallel and coupled to the fourth node MD4. The switch device of the second switch set 412 includes switches SW21~SW2n which are coupled between the fourth node MD4 and the gain transistors Ma1~Man of the first set of gain transistors 413 and switched in response to the second set of switch control signals $\overline{S1}$~$\overline{Sn}$.

Similarly, the third switch set 421 may include a plurality of switch devices coupled in parallel and coupled to the fourth node MD4. The switch device of the third switch set 421 includes a plurality of switches SW31~SW3n which are coupled between the fourth node MD4 and the gain transistors Md1~Mdn of the second set of gain transistors 423 and switched in response to the first set of switch control signals S1~Sn.

Also, the fourth switch set 422 may include a plurality of switch devices coupled in parallel and coupled to the third node MD3. The switch device of the fourth switch set 422 includes switches SW41~SW4n which are coupled between the third node MD3 and the gain transistors Md1~Mdn of the second set of gain transistors 423 and switched in response to the second set of switch control signals $\overline{S1}$~$\overline{Sn}$.

Similarly, the transistors may have the following size ratio relationship: M1=M2; M3=M4; Ma1=Md1, Ma2=Md2, ..., Man=Mdn. In the present embodiment, since the circuit is a differential circuit, it may be arranged that Ma1=Md1, Ma2=Md2, ..., Man=Mdn.

Similarly, by controlling the logic levels of the first set of switch control signals S1~Sn and the second set of switch control signals $\overline{S1}$~$\overline{Sn}$ respectively, the variable gain amplifier circuit 400 may have different gains. For example, when one of the switches of the first set of switch control signals S1~Sn is switched to a high level, the gain of the variable gain amplifier circuit 400 is increased. Conversely, when one of the first set of switch control signals S1~Sn is switched to a low level, the gain of the variable gain amplifier circuit 400 is decreased. When the signals of the first set of switch control signals S1~Sn are all at high levels, the gain of the variable gain amplifier circuit 400 is at a maximum. When the signals of the first set of switch control signals S1~Sn are all at low levels, the gain of the variable gain amplifier circuit 400 is at a minimum.

Like FIG. 1 and FIG. 3, the first gain switching circuit 410 may implement a first current path and a second current path. The first current path may be coupled between the first node MD1 and the third node MD3. The second current path may be coupled between the first node MD1 and the fourth node MD4. Similarly, the second gain switching circuit 420 may implement a third current path and a fourth current path. The third current path may be coupled between the second node MD2 and the fourth node MD4. The fourth current path may be coupled between the second node MD2 and the third node MD3. The first current path and the third current path receive the first set of switch control signals S1~Sn to be controlled thereby. The second current path and the fourth current path receive the second set of switch control signals $\overline{S1}$~$\overline{Sn}$ to be controlled thereby. Also, when the first set of switch control signals S1~Sn (or the second set of switch control signals $\overline{S1}$~$\overline{Sn}$)) has different H-L combinations or has different numbers of high-level and low-level signals, the current paths may have different equivalent resistances, so as to change the gain of the variable gain amplifier circuit 400.

Similarly, in switching of the gain, the currents flowing through the transistors M1 and M2 of the variable gain amplifier circuit 400 remain unchanged, so that the linearity of the amplifier is maintained, and the variable gain amplifier circuit 400 may achieve a wide range of gain adjustment.

According to the above embodiments of the present disclosure, a wide range of gain adjustment may be achieved by the subtraction/addition of AC signals, and the embodiments of the present application may be realized at a high frequency without additional parasitic capacitances.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A variable gain amplifier circuit, comprising:
    a first transistor and a second transistor respectively coupled to a first node and a second node, for receiving a differential input signal pair;
    a third transistor and a fourth transistor, the third transistor coupled between the first node and a third node, and the fourth transistor coupled between the second node and a fourth node;
    a first gain switching circuit coupled between the first node and the third node and further cross-coupled to the fourth node; and
    a second gain switching circuit coupled between the second node and the fourth node and further cross-coupled to the third node.

2. The variable gain amplifier circuit according to claim 1, wherein the third and the fourth transistors are coupled to a fixed voltage.

3. The variable gain amplifier circuit according to claim 1, wherein,
    the first gain switching circuit comprises:
        a first switch set comprising one or more switch devices coupled in parallel and coupled to the third node; and
        a second switch set comprising one or more switch devices coupled in parallel and coupled to the fourth node; and
    the second gain switching circuit comprises:
        a third switch set comprising one or more switch devices coupled in parallel and coupled to the fourth node; and
        a fourth switch set comprising one or more switch devices coupled in parallel and coupled to the third node.

4. The variable gain amplifier circuit according to claim 3, wherein the first switch set and the third switch set are switched in response to a first set of switch control signals, the second switch set and the fourth switch set are switched in response to a second set of switch control signals, and the second set of switch control signals is inverted to the first set of switch control signals.

5. The variable gain amplifier circuit according to claim 3, wherein,
    the one or more switch devices of the first switch set comprise one or more transistors coupled in parallel between the first node and the third node, and gates of the transistors are coupled to a first set of switch control signals; and
    the one or more switch devices of the third switch set comprise one or more transistors coupled in parallel between the second node and the fourth node, and gates of the transistors are coupled to the first set of switch control signals.

6. The variable gain amplifier circuit according to claim 5, wherein:
    the one or more switch devices of the second switch set comprise one or more transistors coupled in parallel between the first node and the fourth node, and gates of the transistors are coupled to a second set of switch control signals; and
    the one or more switch devices of the fourth switch set comprise one or more transistors are mutually coupled in parallel between the second node and the third node, and the gates of the transistors are coupled to the second set of switch control signals.

7. The variable gain amplifier circuit according to claim 3, wherein:
    the first gain switching circuit further comprises a first set of gain transistors comprising one or more gain transistors coupled among the first node, the first switch set and the second switch set; and
    the second gain switching circuit further comprises a second set of gain transistors comprising one or more gain transistors coupled among the second node, the third switch set and the fourth switch set.

8. The variable gain amplifier circuit according to claim 7, wherein gate of each gain transistor of the first and the second sets of gain transistors is coupled to a fixed voltage.

9. The variable gain amplifier circuit according to claim 7, wherein:
    the one or more switch devices of the first switch set comprise one or more switches, which are coupled between the third node and the one or more gain transistors of the first set of gain transistors and switched in response to the first set of switch control signals; and
    the one or more switch devices of the third switch set comprise one or more switches coupled between the fourth node and the one or more gain transistors of the second set of gain transistors, and switched in response to the first set of switch control signals.

10. The variable gain amplifier circuit according to claim 9, wherein:
    the one or more switch devices of the second switch set comprise one or more switches, which are coupled between the fourth node and the one or more gain transistors of the first set of gain transistors and switched in response to the second set of switch control signals; and the one or more switch devices of the fourth switch set comprises one or more switches, which are coupled between the third node and the one or more gain transistors of the second set of gain transistors and switched in response to the second set of switch control signals.

11. The variable gain amplifier circuit according to claim 1, wherein:

the first gain switching circuit comprises a first current path coupled between the first node and the third node, and a second current path coupled between the first node and the fourth node; and the second gain switching circuit comprises a third current path coupled between the second node and the fourth node, and a fourth current path coupled between the second node and the third node.

12. The variable gain amplifier circuit according to claim 11, wherein the first current path and the third current path receive and are controlled by a first set of switch control signals, the second current path and the fourth current path receive and are controlled by a second set of switch control signals, and the second set of switch control signals is inverted to the first set of switch control signals.

13. A variable gain amplifier circuit, comprising:

a first transistor and a second transistor respectively coupled to the first node and the second node, for receiving a differential input signal pair;

a third transistor and a fourth transistor, the third transistor coupled between the first node and a third node, and the fourth transistor coupled between the second node and a fourth node, wherein the third and the fourth transistors are coupled to a fixed voltage;

a first gain switching circuit comprising a first switch set, and a second switch set, wherein the first switch set comprises one or more switch devices coupled in parallel and coupled to the third node, and the second switch set comprises one or more switch devices coupled in parallel and coupled to the fourth node; and a second gain switching circuit, comprising: a third switch set, and a fourth switch set, wherein the third switch set comprises one or more switch devices coupled in parallel and coupled to the fourth node, and the fourth switch set comprises one or more switch devices coupled in parallel and coupled to the third node.

14. The variable gain amplifier circuit according to claim 13, wherein the first switch set and the third switch set are switched in response to a first set of switch control signals, the second switch set and the fourth switch set are switched in response to a second set of switch control signals, and the second set of switch control signals is inverted to the first set of switch control signals.

15. The variable gain amplifier circuit according to claim 13, wherein:

the first gain switching circuit further comprises a first set of gain transistors comprising one or more gain transistors coupled among the first node, the first switch set and the second switch set; and the second gain switching circuit further comprises a second set of gain transistors comprising one or more gain transistors coupled among the second node, the third switch set and the fourth switch set.

16. The variable gain amplifier circuit according to claim 15, wherein gate of each gain transistor of the first and the second sets of gain transistors is coupled to a fixed voltage.

17. A variable gain amplifier circuit, comprising:

a first transistor and a second transistor respectively coupled to the first node and the second node for receiving a differential input signal pair;

a third transistor and a fourth transistor, the third transistor coupled between the first node and a third node, and the fourth transistor coupled between the second node and a fourth node, wherein the third and the fourth transistors are coupled to a fixed voltage;

a first gain switching circuit comprising a first current path coupled between the first node and the third node, and a second current path coupled between the first node and the fourth node; and a second gain switching circuit comprising a third current path coupled between the second node and the fourth node, and a fourth current path coupled between the second node and the third node.

18. The variable gain amplifier circuit according to claim 17, wherein the first current path and the third current path receive a first set of switch control signals, the second current path and the fourth current path receive a second set of switch control signals, and the second set of switch control signals is inverted to the first set of switch control signals.

19. The variable gain amplifier circuit according to claim 17, wherein numbers of high-level signals and low-level signals of the first and the second sets of switch control signals are adjusted to change a gain of the adjustable gain amplifier.

* * * * *